(12) United States Patent
Zhang et al.

(10) Patent No.: US 7,551,694 B2
(45) Date of Patent: Jun. 23, 2009

(54) LIMITER BASED ANALOG DEMODULATOR

(75) Inventors: Zhongxuan Zhang, Fremont, CA (US); Lixin Zhao, Shanghai (CN); Steve Xuefeng Jiang, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 417 days.

(21) Appl. No.: 11/307,015

(22) Filed: Jan. 19, 2006

(65) Prior Publication Data

US 2007/0189420 A1  Aug. 16, 2007

Related U.S. Application Data

(60) Provisional application No. 60/645,847, filed on Jan. 20, 2005.

(51) Int. Cl.
*H04L 27/14* (2006.01)
(52) U.S. Cl. .................. 375/326; 375/322; 375/354; 375/316; 375/229; 375/371; 375/225; 370/503; 370/442; 370/354; 348/614; 348/607
(58) Field of Classification Search .............. 375/326, 375/322, 354, 316, 229, 371, 324, 225; 370/503, 370/442, 354; 348/614, 607
See application file for complete search history.

(56) References Cited

U.S. PATENT DOCUMENTS

| | | | | |
|---|---|---|---|---|
| 6,031,880 A | * | 2/2000 | Li et al. | 375/326 |
| 6,104,237 A | * | 8/2000 | Mabuchi | 329/307 |
| 6,868,129 B2 | * | 3/2005 | Li et al. | 375/324 |
| 6,959,057 B1 | * | 10/2005 | Tuohino | 375/354 |
| 7,280,618 B2 | * | 10/2007 | Demir et al. | 375/322 |
| 7,298,420 B2 | * | 11/2007 | Lee | 348/614 |
| 2004/0264601 A1 | | 12/2004 | Demir et al. | |

OTHER PUBLICATIONS

U.S. Appl. No. 11/442,838, filed Dec. 2006, Wang et al.*
Yoichi Matsumoto, Shuji Kubota, Shuzo Kato; "High-Performance Coherent Demodulator LSIC for Wireless Personal Communications"; IEEE Transactions on Vehicular Technology, vol. 45, No. 3, Aug. 1996; pp. 475-483.
Notification of Transmittal of the International Search Report and The Written Opinion of The International Searching Authority, or the Declaration dated Jun. 6, 2008 in reference to PCT/US2006/01898.

* cited by examiner

*Primary Examiner*—Chieh M. Fan
*Assistant Examiner*—Eva Puente

(57) ABSTRACT

A limiter based analog demodulator includes a power amplifier receiving a base-band signal and a local clock operating at the base-band frequency. A first multiplier receives an output from the power amplifier and the local clock to provide an in phase signal. A quadrature phase shifter receives the local clock and a second multiplier receives the output from the power amplifier and an output from the phase shifter to provide a quadrature signal. Analog filters receive the in phase and quadrature signals and analog to digital converters connected to the analog filters provide digitized in phase and quadrature signals. The phase detector then receives the digitized in phase and quadrature signals.

4 Claims, 3 Drawing Sheets

LIMITER BASED ANALOG DEMODULATOR

REFERENCES TO RELATED APPLICATIONS

This application claims priority of U.S. Provisional Patent Application No. 60/645,847 filed on Jan. 20, 2005 having the same title as the present application.

FIELD OF THE INVENTION

This invention relates generally to the field of demodulating transmission signals and, more particularly, to a demodulator employing analog phase detection of the signal prior to analog to digital conversion.

BACKGROUND OF THE INVENTION

Legacy communications systems such as the Personal Handy-phone System (PHS) are configured to be simple and low cost. Differential demodulation has been adopted based on the technological constraints present at the time of designing these systems for baseband demodulation and therefore does not have the capability to combat inter-symbol-interference typically introduced by multi-path fading.

It is therefore desirable to provide a modernized baseband design compatible with or to retrofit these legacy systems. It is further desirable to employ advanced DSP algorithms and introduce adaptive equalization to realize coherent demodulation.

SUMMARY OF THE INVENTION

A limiter based analog demodulator incorporating the present invention includes a power amplifier receiving a baseband signal and a local clock operating at the base-band frequency. A first multiplier receives an output from the power amplifier and the local clock to provide an in phase signal. A quadrature phase shifter receives the local clock and a second multiplier receives the output from the power amplifier and an output from the phase shifter provides a quadrature signal. A first analog filter receives the in phase signal and a second analog filter receives the quadrature signal. A first analog to digital converter connected to the first analog filter provides a digitized in phase signal and a second analog to digital converter connected to the second analog filter provides a digitized quadrature signal. The phase detector then receives the digitized in phase and quadrature signals.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1:
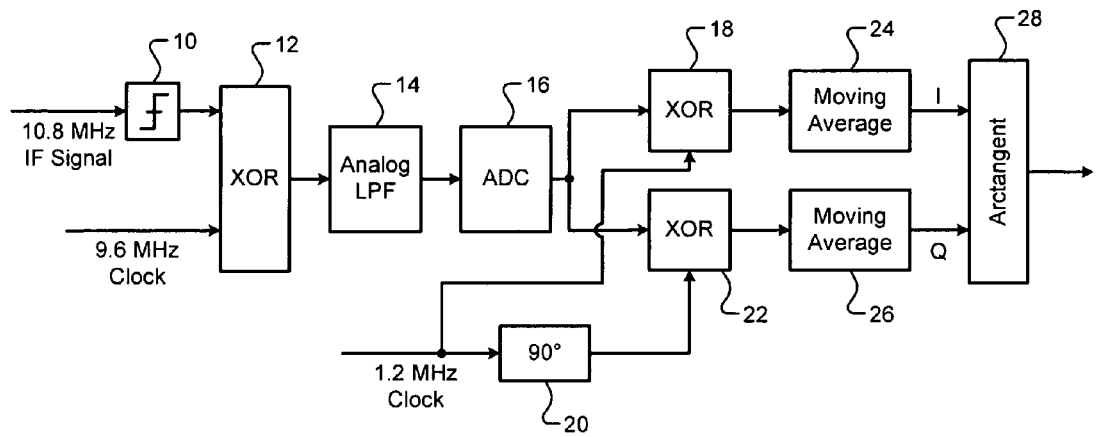
FIG. 1 is a block diagram of the elements of a prior art limiter based PHS demodulation architecture.

The present invention is defined for an exemplary embodiment employed with a PHS communication system and standard. Shown in FIG. 1 is a limiter based PHS demodulation architecture which is typically employed. The 10.8 MHz IF signal received for demodulation is passed through the power amplifier 10 and mixed through an Exclusive Or 12 with a 9.6 MHz clock prior to filtering in an analog low pass filter (LPF) 14. The filtered signal is then converted to the digital domain in Analog to Digital converter (ADC) 16. The local 1.2 MHz oscillator is mixed 18 with the In-phase (I) signal and, after phase shifting 20 of 90° is mixed 22 with the Quadrature (Q) signal. A moving average is created of the I and Q signals, 24 and 26 respectively and the phase angle is calculated using the arctangent of I and Q 28. The moving average on relative phase difference to the local carrier is done in the digital domain, for example at 100 times symbol rate. Due to the effects of digital sampling, a difference between the output of the phase detector and an ideal phase detector will always be present.

Figure 2:
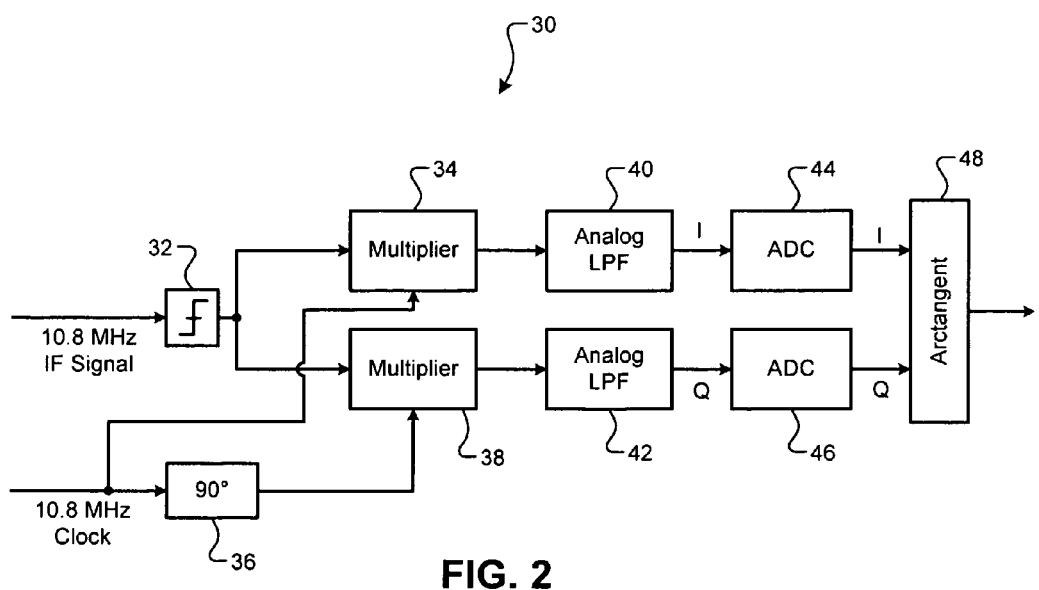
FIG. 2 is a block diagram of the elements of the present invention.

FIG. 2 shows an analog down mixer 30 according to the present invention. The 10.8 MHz IF signal is received in a power amplifier 32. The signal is mixed with a local clock, also operating at 10.8 MHz, in phase in multiplier 34 and phase shifted 90° 36 in multiplier 38. The two signals are then filtered with analog LPFs, 40 and 42 respectively. The two signals are then converted through ADCs 44 and 46 to provide digital domain I and Q. An arctangent function 48 operating on I and Q provides the phase difference for symbol decoding.

Figure 3:
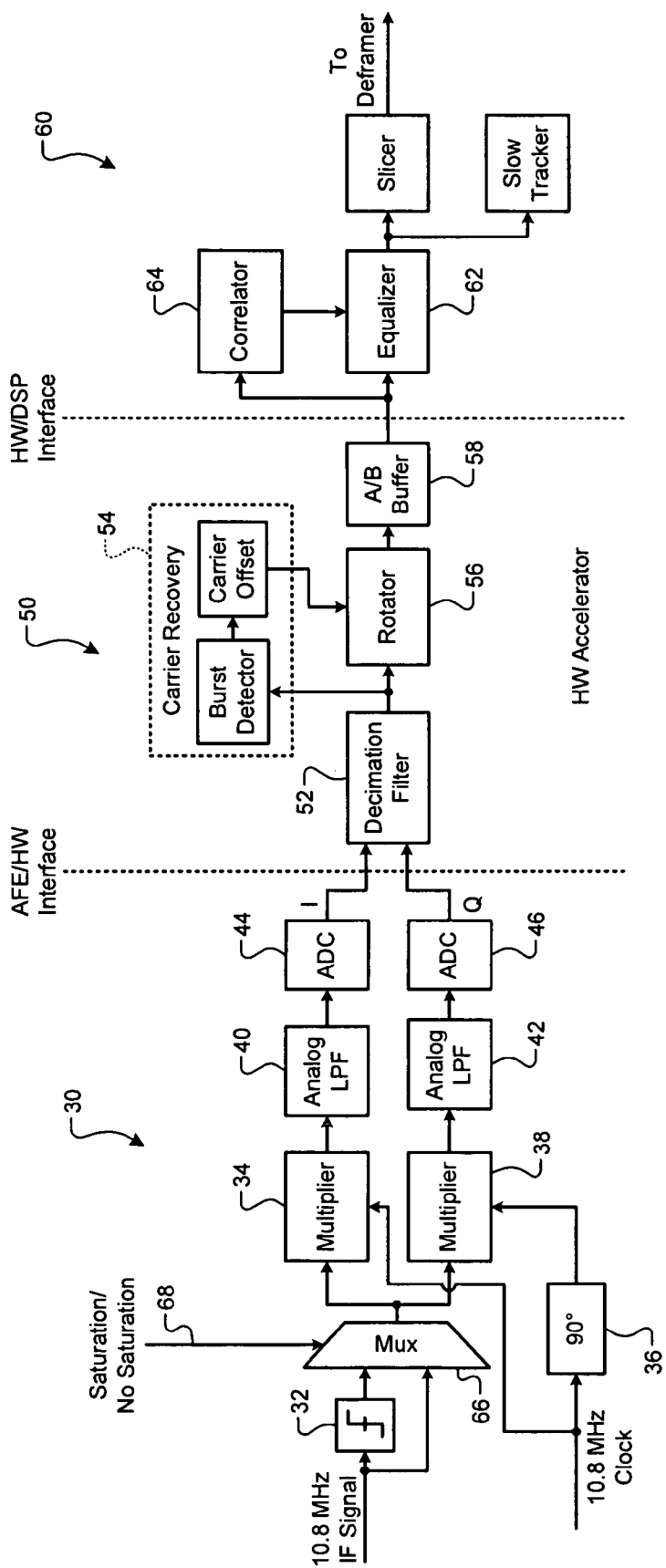
FIG. 3 shows an embodiment for a receiver employing coherent demodulation with adaptive equalization in which the phase detector of the present invention is employed.

The down mixer of the present invention implemented in a receiver system is shown in FIG. 3. The converted digital signal from the ADCs 44 and 46 from the down mixer 30 is passed to a hardware accelerator 50 and further filtered and decimated 52 to 3× symbol rate, e.g. 576 kHz. This signal first passes a Carrier Recovery block 54 and then a Rotator block 56 and then to a storage register 58 which for the embodiment disclosed herein is a dual or A/B register. The function of Carrier Recovery block is to detect the burst and estimate carrier frequency offset between received and transmitted signals. This allows the following Rotator block 56 to compensate for carrier offset. This rotated signal is then passed to a DSP 60 with an Equalizer 62. An adaptive decision-directed equalizer is applied where the training sequence is the unique word (UW) in the burst. Therefore an accurate position of UW is required. This information is acquired via a correlation block 64. The input data is correlated with UW and therefore, after the peak of the correlation result is detected, the UW location in the burst data can be determined. This process, typically known as conventional coherent detection, is employed in the present invention even though the base-band modulation is DQPSK. Theoretically this kind of coherent detection can have 3 dB better performance than differential detection.

The embodiment shown in FIG. 3 is further equipped to provide a selection of detection modes. Saturation of the received signal amplitude in the amplifier will destroy the signal phase information, which is critical to PI/4 DQPSK demodulation. Therefore, to allow differential detection, a multiplexer 66 is inserted in the signal path to receive either the output of the amplifier 32 or the input signal directly. The multiplexer signal selection is controlled by a saturation/no saturation signal 68. Saturation versus no saturation is equivalent to a non-equalization mode versus an equalization mode. Non-equalization mode provides basic differential detection. Alternatively, a PI/4 DQPSK signal can be detected with equalization techniques as described above. The saturation/non saturation signal is set by a register value according the desired system setting.

Figure 4:
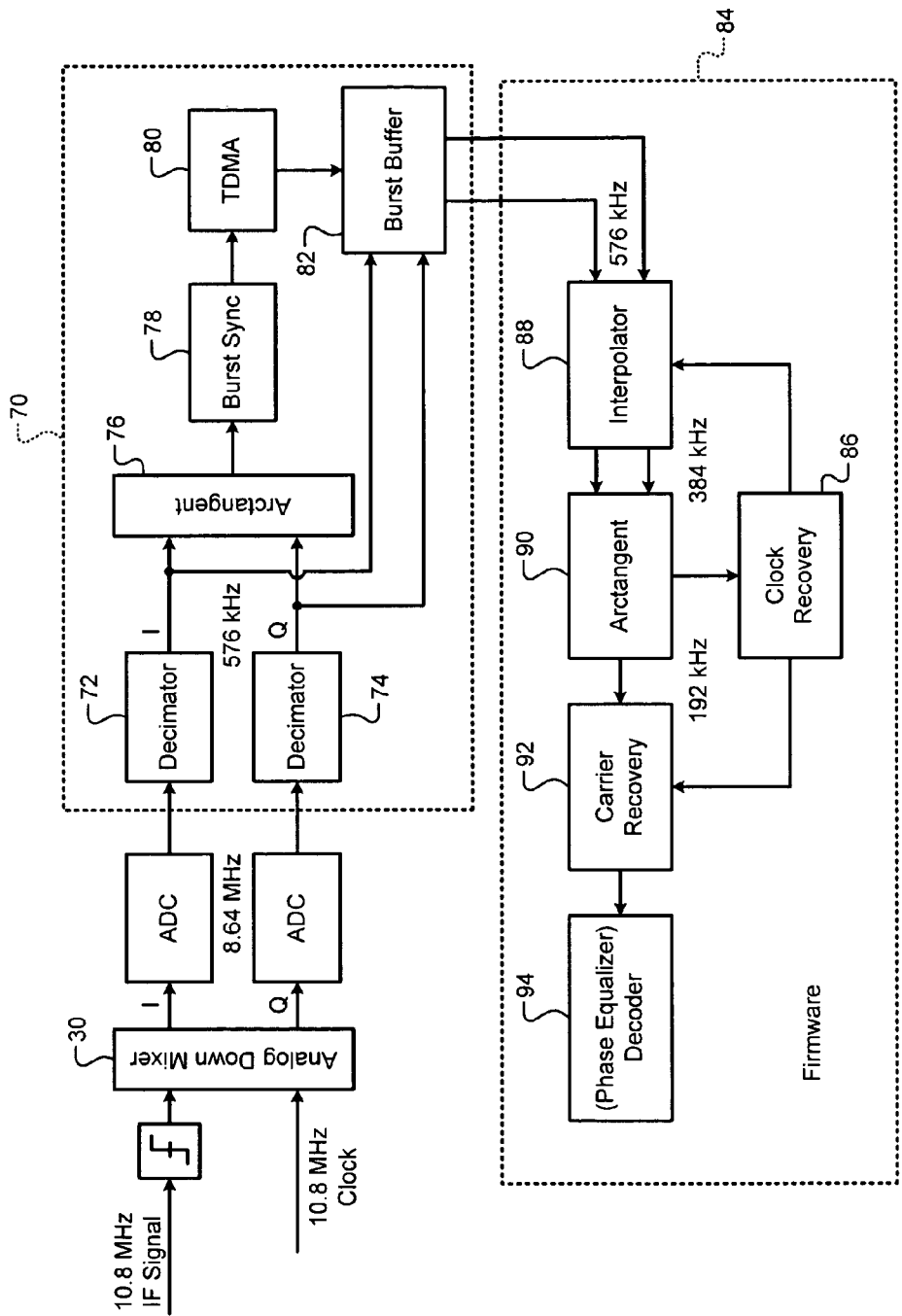
FIG. 4 shows an embodiment for a receiver employing coherent demodulation with differential decoding in which the phase detector of the present invention is employed.

The down mixer of the present invention implemented in an alternative receiver system is shown in FIG. 4. The converted digital signal from the ADCs 44 and 46 of the down mixer is passed to a hardware accelerator 70 and further filtered and decimated 72, 74 to 3× symbol rate, e.g. 576 kHz before being acted on by an arctangent function 76. This signal first passes a Burst Sync block 78 and then a TDMA block 80 to generate a slot timing signal to control a storage register 82 which for the embodiment disclosed herein is a dual or A/B register (Burst Buffer). The TDMA slot synchronized signals are then passed to the DSP processor 84 through the burst buffer 82. The firmware implemented Clock Recovery block 86 will estimate the timing offset and pass the parameter to the firmware implemented Interpolator block 88 to do timing adjustment and 3 to 2 rate conversion. The converted signal will be passed to ArcTan block 90 to convert the in phase and quadrature signals into the phase signal. The converted phase signal will be passed to Carrier Recovery block 92 and Decoder block 94 to do carrier offset adjustment and final decoding.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A limiter based analog demodulator comprising:
   a power amplifier receiving a base-band signal;
   a local clock operating at the base-band frequency;
   a first multiplier receiving an output from the power amplifier and the local clock to provide an in phase signal;
   a quadrature phase shifter receiving the local clock;
   a second multiplier receiving the output from the power amplifier and an output from the quadrature phase shifter to provide a quadrature signal;
   a first analog filter receiving the in phase signal;
   a second analog filter receiving the quadrature signal;
   a first analog to digital converter connected to the first analog filter and providing a digitized in phase signal;
   a second analog to digital converter connected to the second analog filter and providing a digitized quadrature signal; and
   a phase detector that detects a phase of the digitized in phase and quadrature signals,
   a decimation filter receiving the digitized in phase and quadrature signals and providing input data at three times a symbol rate;
   a burst detector that receives the input data;
   a carrier offset block responsive to the burst detector and providing an offset angle;
   a rotator responsive to the offset angle to rotate the input data; and
   an equalizer receiving data from the rotator for coherent demodulation.

2. A limiter based demodulator comprising:
   a power amplifier receiving a base-band signal;
   a local clock operating at a base-band frequency;
   a first multiplier receiving an output from the power amplifier and the local clock to provide an in phase signal;
   a quadrature phase shifter receiving the local clock;
   a second multiplier receiving the output from the power amplifier and an output from the quadrature phase shifter to provide a quadrature signal;
   a first analog filter receiving the in phase signal;
   a second analog filter receiving the quadrature signal;
   a first analog to digital converter connected to the first analog filter and providing a digitized in phase signal;
   a second analog to digital converter connected to the second analog filter and providing a digitized quadrature signal; and
   a phase detector that receives the digitized in phase and quadrature signals and includes:
      a hardware accelerator receiving the digitized in phase and quadrature signals, the hardware accelerator including:
         means for filtering and decimating the digitized in phase and quadrature signals to three times symbol rate;
         a Burst Sync means and a TDMA means receiving the filtered and decimated signals to generate a slot timing signal;
         a storage register responsive to the slot timing signal;
      a DSP processor receiving signals from the storage registers, the DSP processor including:
         a Clock Recovery means for estimating a timing offset;
         an Interpolator means to perform timing adjustment and 3 to 2 rate conversion based on the timing offset;
         an ArcTan means to convert the in phase and quadrature signals into a phase signal;
         a Carrier Recovery means to perform carrier offset adjustment of the phase signal; and
         Decoder means to perform final decoding of the phase signal.

3. A limiter based analog demodulator comprising:
   a power amplifier receiving a base-band signal;
   a local clock operating at a base-band frequency;
   a first multiplier receiving an output from the power amplifier and the local clock to provide an in phase signal;
   a quadrature phase shifter receiving the local clock;
   a second multiplier receiving the outout from the power amplifier and an output from the quadrature phase shifter to provide a quadrature signal;
   a first analog filter receiving the in phase signal;
   a second analog filter receiving the quadrature signal;
   a first analog to digital converter connected to the first analog filter and providing a digitized in phase signal;
   a second analog to digital converter connected to the second analog filter and providing a digitized quadrature signal; and
   a phase detector that detects a phase of the digitized in phase and quadrature signals, wherein the phase detector includes:
   a hardware accelerator receiving the digitized in phase and quadrature signals, the hardware accelerator including:
      a decimator block that decimates the digitized in phase and quadrature signals to three times symbol rate;
      a burst sync block and a time division multiple access (TDMA) block receiving the decimated signals to generate a slot timing signal; and
      a storage register responsive to the slot timing signal; and
   a DSP processor receiving signals from the storage register, the DSP processor including:
      a clock recovery block for estimating a timing offset;
      an interpolator block to perform timing adjustment and 3 to 2 rate conversion based on the timing offset;
      an arctangent block to convert in phase and quadrature signals from the interpolator block into a phase signal;
      a carrier recovery block that performs carrier offset adjustment of the phase signal; and
      a decoder block that performs final decoding of the adjusted phase signal.

4. A phase detector including:
a hardware accelerator receiving digitized in phase and quadrature signals and including:
   a decimator block that decimates the digitized in phase and quadrature signals to three times symbol rate;
   a burst sync block and a time division multiple access (TDMA) block receiving the decimated signals to generate a slot timing signal; and
   a storage register responsive to the slot timing signal; and
a DSP processor receiving signals from the storage register, the DSP processor including:
   a clock recovery block for estimating a timing offset;
   an interpolator block to perform timing adjustment and 3 to 2 rate conversion based on the timing offset;
   an arctangent block to convert in phase and quadrature signals from the interpolator block into a phase signal;
   a carrier recovery block that performs carrier offset adjustment of the phase signal; and
   a decoder block that performs final decoding of the adjusted phase signal.

* * * * *

UNITED STATES PATENT AND TRADEMARK OFFICE
CERTIFICATE OF CORRECTION

PATENT NO. : 7,551,694 B2
APPLICATION NO. : 11/307015
DATED : June 23, 2009
INVENTOR(S) : Zhongxuan Zhang et al.

It is certified that error appears in the above-identified patent and that said Letters Patent is hereby corrected as shown below:

Column 3, Line 43    Insert -- wherein the phase detector includes: -- after "signals,"

Column 3, Line 55    Insert -- analog -- after "based"

Signed and Sealed this

Fifteenth Day of September, 2009

David J. Kappos
*Director of the United States Patent and Trademark Office*